United States Patent
Kim

(10) Patent No.: US 11,551,766 B2
(45) Date of Patent: Jan. 10, 2023

(54) MEMORY DEVICE AND OPERATING METHOD THEREOF

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 2 days.

(21) Appl. No.: 16/950,197

(22) Filed: Nov. 17, 2020

(65) Prior Publication Data
US 2021/0327516 A1 Oct. 21, 2021

(30) Foreign Application Priority Data
Apr. 21, 2020 (KR) .......................... 10-2020-0048045

(51) Int. Cl.
*G11C 16/28* (2006.01)
*G11C 16/08* (2006.01)
*G11C 16/30* (2006.01)
*G11C 16/10* (2006.01)

(52) U.S. Cl.
CPC .............. *G11C 16/28* (2013.01); *G11C 16/08* (2013.01); *G11C 16/10* (2013.01); *G11C 16/30* (2013.01)

(58) Field of Classification Search
CPC ...................................................... G11C 16/28
See application file for complete search history.

(56) References Cited

U.S. PATENT DOCUMENTS

| | | | |
|---|---|---|---|
| 2012/0195130 A1* | 8/2012 | Park .................... | G11C 16/14 365/185.29 |
| 2013/0250675 A1* | 9/2013 | Hung .................. | G11C 16/3431 365/185.02 |
| 2019/0035443 A1* | 1/2019 | Park .................... | G11C 11/4076 |
| 2019/0267103 A1* | 8/2019 | Jung .................... | G11C 16/28 |
| 2019/0362798 A1* | 11/2019 | Yang .................. | G11C 16/3418 |

FOREIGN PATENT DOCUMENTS

| KR | 10-2010-0100437 | 9/2010 |
| KR | 10-2017-0024429 | 3/2017 |

* cited by examiner

*Primary Examiner* — Douglas King
(74) *Attorney, Agent, or Firm* — IP & T Group LLP

(57) ABSTRACT

A memory device includes: one or more planes each including a plurality of memory blocks; and a control circuit for selectively performing a dummy read operation before a valid read operation on the first memory block, according to whether a read command on the first memory block is firstly received from a host after a program operation is performed on a plane including the first memory block.

10 Claims, 11 Drawing Sheets

|  | BLOCK1 | BLOCK2 | BLOCK3 | ... | BLOCKn |
|---|---|---|---|---|---|
| PLANE1 | 0 | 1 | 1 | ... | 0 |
| PLANE2 | 1 | 1 | 1 | ... | 1 |

MEMORY DEVICE AND OPERATING METHOD THEREOF

CROSS-REFERENCE TO RELATED APPLICATION(S)

The present application claims priority under 35 U.S.C. § 119(a) to Korean Patent Application No. 10-2020-0048045, filed on Apr. 21, 2020, the disclosure of which is incorporated herein by reference in its entirety.

BACKGROUND

1. Field

Various embodiments of the present disclosure generally relate to a non-volatile memory device.

2. Description of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSD).

SUMMARY

Various embodiments of the present disclosure are directed to a memory device and an operating method thereof, which can reduce an access time.

In accordance with an embodiment of the present invention, a memory device includes: one or more planes each including a plurality of memory blocks; and a control circuit for selectively performing a dummy read operation before a valid read operation on the first memory block, according to whether a read command on the first memory block is firstly received from a host after a program operation is performed on a plane including the first memory block.

In accordance with an embodiment of the present invention, an operating method of a memory device that includes one or more planes each including a plurality of memory blocks, the operating method includes: selectively performing a dummy read operation on a first memory block to be read, according to whether a read operation has been performed on the first memory block after a program operation is performed on a plane including the first memory block; and performing a valid read operation on the first memory block in response to a read command.

In accordance with an embodiment of the present invention, a memory device includes: one or more planes each including a plurality of memory blocks; word lines and bit lines coupled to memory cells in the one or more planes; and a control circuit suitable for removing holes, which have flowed into a channel after a program operation is performed, by applying one or more first read voltages, among a plurality of read voltages, to a selected word line in response to a read command, applying, to the selected word line, second read voltages, among the plurality of read voltages, the second read voltages being different than the first read voltages, and reading data based on a current flowing through bit lines by applying the first and second read voltages.

In accordance with an embodiment of the present invention, an operating method of a memory device, the operating method includes: performing a program operation on a first block within a plane without performing a dummy read operation on all blocks within the plane; performing, in response to a read command for reading data from a second block within the plane, a first read operation on the second block to restore a threshold voltage distribution of cells within the second block, the distribution having been distorted by the program operation; and performing, in response to the read command, a second read operation on the second block.

The first read operation may be the dummy read operation, and the second read operation may be for reading the data.

The first read operation is performed with one or more read biases in a middle of a range of read biases for reading the data, and wherein the second read operation is performed with remaining read biases, excluding the one or more middle range read biases.

BRIEF DESCRIPTION OF THE DRAWINGS

FIG. 7 is a diagram illustrating a flag in accordance with the first embodiment.

DETAILED DESCRIPTION

Hereinafter, various embodiments of the present disclosure are described below in detail with reference to the accompanying drawings. In the following description, description of known technical material is omitted so as not to obscure the subject matter of the invention. Throughout the specification, reference to "an embodiment," "another embodiment," "first embodiment," "second embodiment" or the like is not necessarily to only one embodiment, and the term "embodiments" when used herein is not necessarily to all embodiments.

Figure 1:
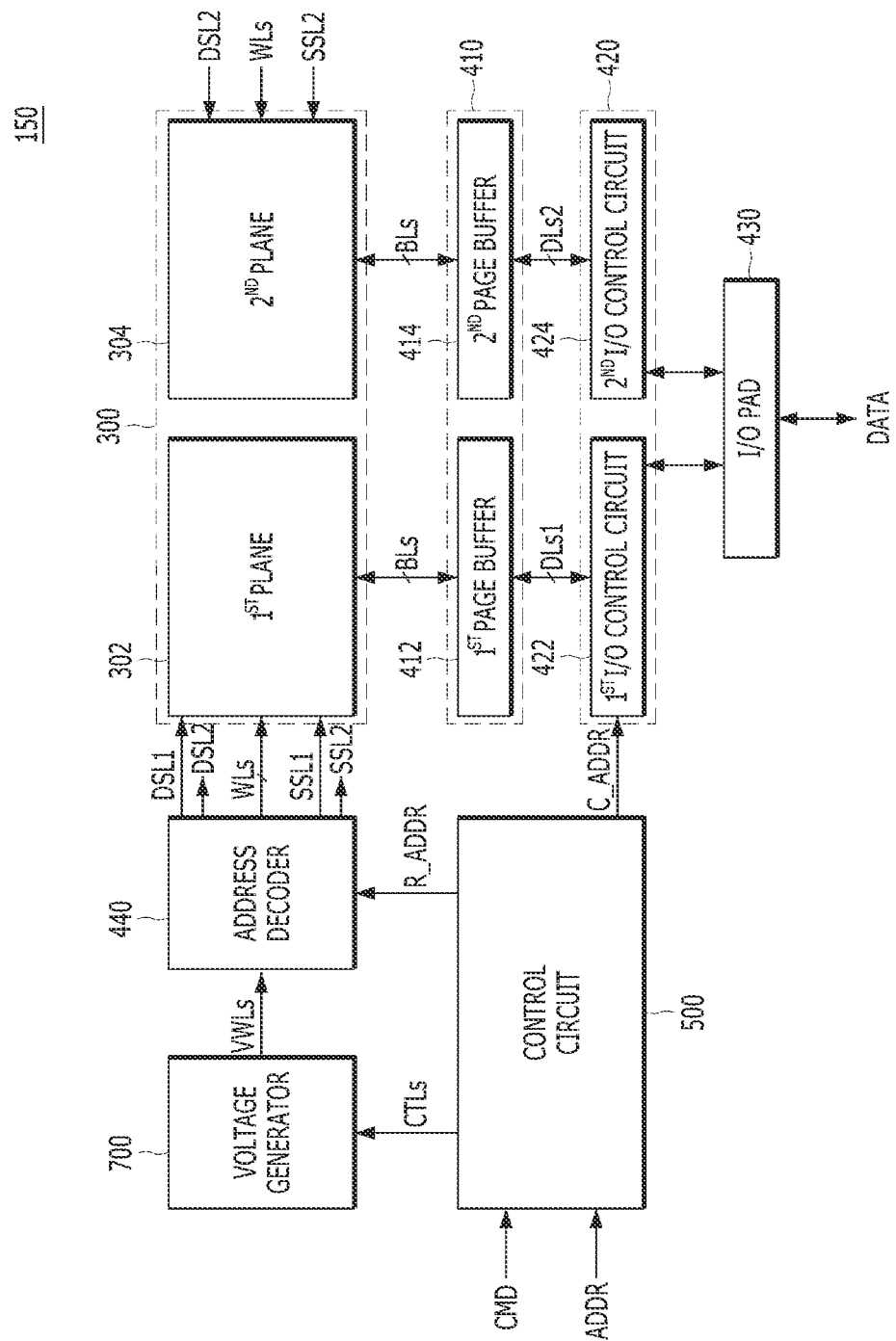
FIG. 1 is a block diagram illustrating a memory device in accordance with an embodiment.

FIG. 1 is a block diagram illustrating a memory device 150 in accordance with an embodiment.

Referring to FIG. 1, the memory device 150 may include a memory cell array 300, an address decoder 440, a page buffer circuit 410, an input/output control circuit 420, an input/output pad 430, a control circuit 500, and a voltage generator 700.

The memory cell array 300 may be coupled to the address decoder 440 through drain select lines DSL1 and DSL2, a plurality of word lines WLs and source selection lines SSL1 and SSL2. In addition, the memory cell array 300 may be coupled to the page buffer circuit 410 through a plurality of bit lines BLs.

The control circuit 500 may control the voltage generator 700, the address decoder 440 and the input/output control circuit 420 based on a command signal CMD and an address signal ADDR which are inputted from an external device.

The voltage generator 700 may generate word line voltages VWLs to supply to the word lines WLs according to an operation mode. A voltage generation operation of the voltage generator 700 may be controlled by control signals CTLs of the control circuit 500.

The address decoder 440 may select a word line to which the word line voltages VWLs are applied, based on a row address signal R_ADDR of the control circuit 500. The address decoder 440 may provide the selected word line with the word line voltages VWLs, and provide a non-selected word line with the word line voltages VWLs as necessary.

The input/output control circuit 420 may control input of data inputted from the input/output pad 430 or output of data outputted to the input/output pad 430, based on a column address signal C_ADDR of the control circuit 500. During a program operation, the input/output control circuit 420 may operate as a write driver that drives the bit lines BLs according to data to be stored in the memory cell array 300. During the program operation, the input/output control circuit 420 may receive the data to be stored in the memory cell array 300 through the input/output pad 430, and drive the bit lines BLs according to the received data. During a read operation or a program verification operation, the input/output control circuit 420 may operate as a sense amplifier for reading data from the memory cell array 300.

The page buffer 410 may buffer data DATA received through the input/output pad 430 and the data DATA to be outputted through the input/output pad 430. The page buffer 410 may include a plurality of latches (not illustrated).

The memory cell array 300 may include a first plane 302 and a second plane 304. The page buffer 410 may include a first page buffer 412 and a second page buffer 414, and the input/output control circuit 420 may include a first input/output control circuit 422 and a second input/output control circuit 424. The first plane 302 may be coupled to the first page buffer 412, and the first page buffer 412 may be controlled by the first input/output control circuit 422. The second plane 304 may be coupled to the second page buffer 414, and the second page buffer 414 may be controlled by the second input/output control circuit 424. That is, the first and second planes 302 and 304 may operate independently of each other under the control of independent input/output control circuits.

According to an embodiment, the memory cell array 300 may be a three-dimensional (3D) memory cell array formed in a 3D structure or a vertical structure on a substrate. In this case, the memory cell array 300 may include vertical memory cell strings including a plurality of memory cells formed by stacking one on another.

Figure 2:
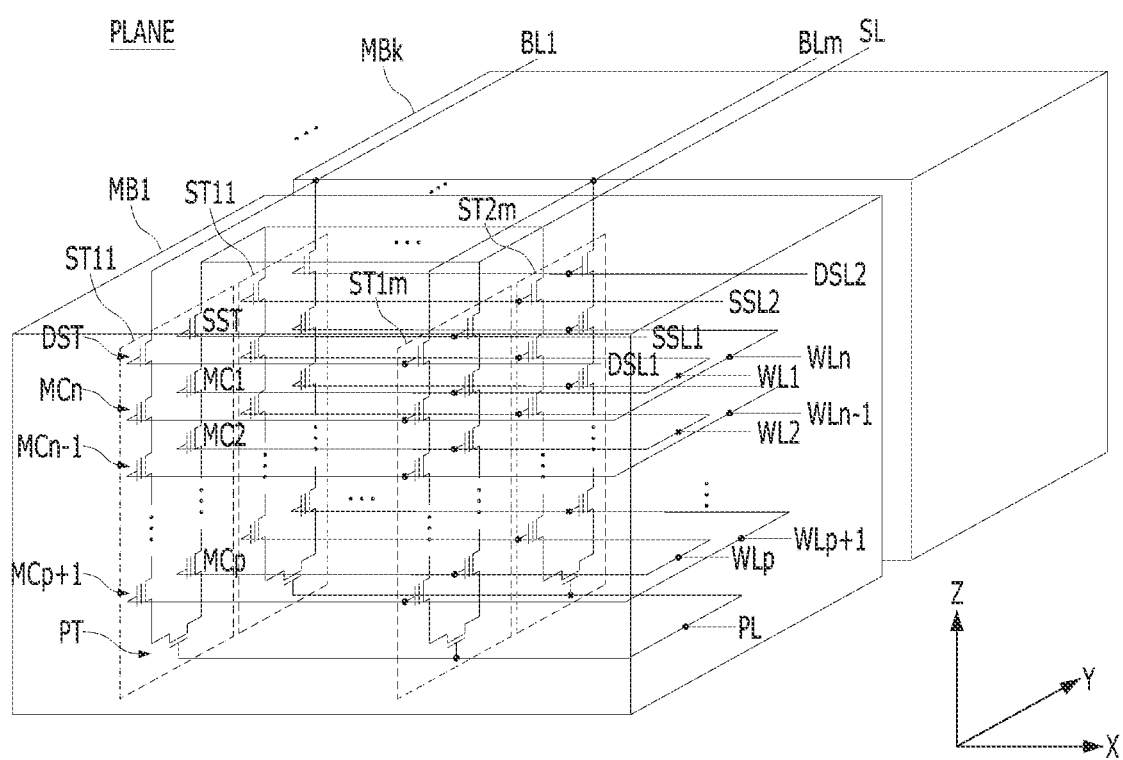
FIGS. 2 and 3 are diagrams illustrating examples of a three-dimensional (3D) memory block.

FIG. 2 is a diagram illustrating an example of a three-dimensional (3D) memory block.

Referring to FIG. 2, a plane PLANE included in the memory cell array 300 may include a plurality of memory blocks MB1 to MBk.

Each of the memory blocks MB1 to MBk may include a plurality of strings ST11 to ST1$m$ and ST21 to ST2$m$. In an embodiment, each of the strings ST11 to ST1$m$ and ST21 to ST2$m$ may be formed in an "U" shape. In the first memory block MB1, "m" strings may be arranged in a row direction, i.e., an "X" direction. Although FIG. 2 illustrates that two strings are arranged in a column direction, i.e., a "Y" direction, this is merely for clarity; three or more strings may be arranged in the column direction.

Each of the strings ST11 to ST1$m$ and ST21 to ST2$m$ may include at least one source selection transistor SST, first to $n^{th}$ memory cells MC1 to MCn, a pipe transistor PT and at least one drain selection transistor DST.

The source and drain selection transistors SST and DST and the memory cells MC1 to MCn may have similar structures. For example, each of the source and drain selection transistors SST and DST and memory cells MC1 to MCn may include a channel film, a tunnel dielectric film, a charge trap film and a blocking dielectric film. For example, a pillar for providing the channel film may be provided to each of the strings ST11 to ST1$m$ and ST21 to ST2$m$. For example, the pillar for providing at least one of the channel film, the tunnel dielectric film, the charge trap film and the blocking dielectric film may be provided to each of the strings ST11 to ST1$m$ and ST21 to ST2$m$.

The source selection transistor SST of each of the strings ST11 to ST1$m$ and ST21 to ST2$m$ may be coupled between a source line SL and memory cells MC1 to MCp.

In an embodiment, source selection transistors of strings arranged in the same row may be coupled to source selection lines extended in the row direction, and source selection transistors of strings arranged in different rows may be coupled to different source selection lines. In FIG. 2, source selection transistors of the strings ST11 to ST1$m$ arranged in a first row may be coupled to a first source selection line SSL1. Source selection transistors of the strings ST21 to ST2$m$ arranged in a second row may be coupled to a second source selection line SSL2.

In another embodiment, source selection transistors of the strings ST11 to ST1$m$ and ST21 to ST2$m$ may be coupled to a single source selection line in common.

The first to $n^{th}$ memory cells MC1 to MCn of each of the strings ST11 to ST1$m$ and ST21 to ST2$m$ may be coupled to one another between the source selection transistor SST and the drain selection transistor DST.

The first to $n^{th}$ memory cells MC1 to MCn may be divided into the first to $p^{th}$ memory cells MC1 to MCp and $(p+1)^{th}$ to $n^{th}$ memory cells MCp+1 to MCn. The first to $p^{th}$ memory cells MC1 to MCp may be sequentially arranged in a vertical direction, i.e., a "Z" direction, and be coupled in series to one another between the source selection transistor SST and the pipe transistor PT. The $(p+1)^{th}$ to $n^{th}$ memory cells MCp+1 to MCn may be sequentially arranged in the vertical direction, i.e., the "Z" direction, and be coupled in series to one another between the pipe transistor PT and the drain selection transistor DST. The first to $p^{th}$ memory cells MC1 to MCp and the p $(p+1)^{th}$ to $n^{th}$ memory cells MCp+1 to MCn may be coupled to one another through the pipe transistor PT. Gates of the first to $n^{th}$ memory cells MC1 to MCn of each of the strings ST11 to ST1$m$ and ST21 to ST2$m$ may be coupled to first to $n^{th}$ word lines WL1 to WLn, respectively.

In an embodiment, at least one of the first to $n^{th}$ memory cells MC1 to MCn may be used as a dummy memory cell. In a case where the dummy memory cell is provided, a voltage or a current of a corresponding string may be stably controlled. A gate of the pipe transistor PT of each of the strings ST11 to ST1m and ST21 to ST2m may be coupled to a pipe line PL.

The drain selection transistor DST of each of the strings ST11 to ST1m and ST21 to ST2m may be coupled between a bit line and the memory cells MCp+1 to MCn. Strings arranged in the row direction may be coupled to a drain selection line extended in the row direction. Drain selection transistors of the strings ST11 to ST1m arranged in the first row may be coupled to a first drain selection line DSL1. Drain selection transistors of the strings ST21 to ST2m arranged in the second row may be coupled to a second drain selection line DSL2.

Figure 3:
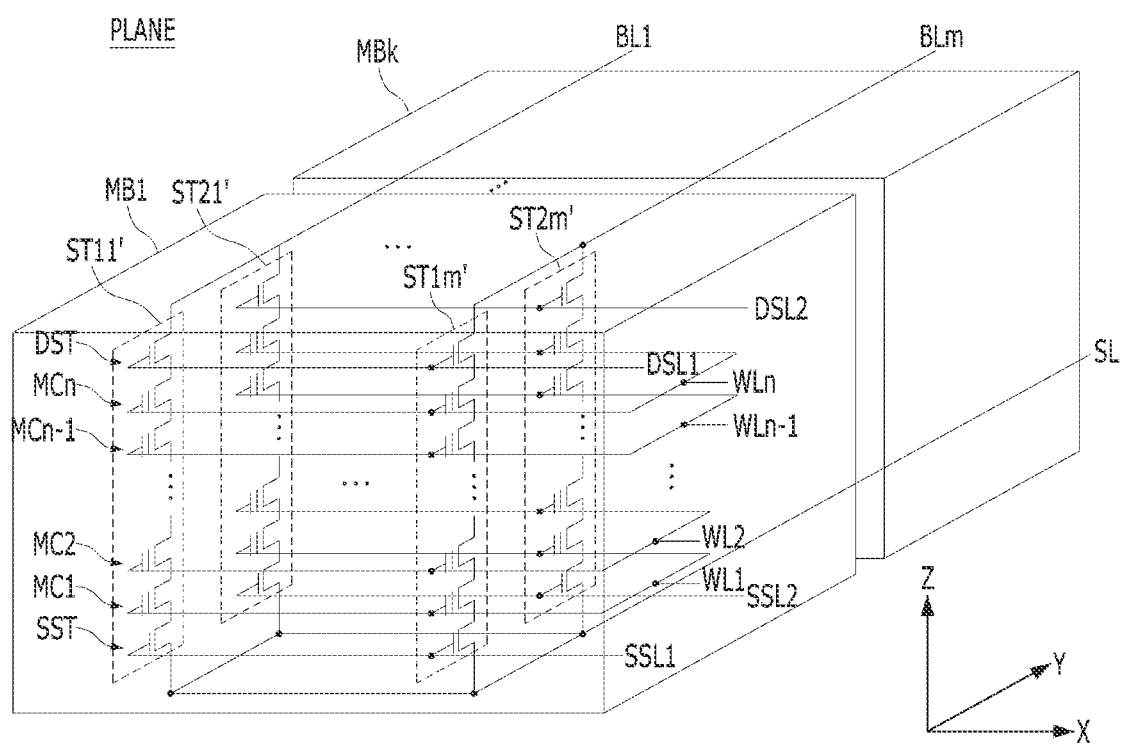

Strings arranged in the column direction may be coupled to bit lines extended in the column direction. In FIG. 3, the strings ST11 and ST21 arranged in a first column may be coupled to a first bit line BL1. The strings ST1m and ST2m arranged in an $m^{th}$ column may be coupled to an $m^{th}$ bit line BLm.

Memory cells coupled to the same word line among the strings arranged in the row direction may constitute one page. For example, memory cells coupled to the first word line WL1 among the strings ST11 to ST1m arranged in the first row may constitute one page. Memory cells coupled to the first word line WL1 among the strings ST21 to ST2m arranged in the second row may constitute another page. As any one of the drain select lines DSL1 and DSL2 is selected, strings arranged in one row direction may be selected. As any one of the word lines WL1 to WLn is selected, a page of one of the selected strings may be selected.

FIG. 3 is a diagram illustrating another example of the 3D memory block.

Referring to FIG. 3, a plane PLANE included in the memory cell array 300 may include a plurality of memory blocks MB1 to MBk. Each of the memory blocks MB1 to MBk may include a plurality of strings ST11' to ST1m' and ST21' to ST2m'. Each of the strings ST11' to ST1m' and ST21' to ST2m' may extend in a vertical direction, i.e., a "Z" direction. In each of the memory blocks MB1 to MBk, "m" strings may be arranged in a row direction, i.e., an "X" direction. Although FIG. 3 illustrates that two strings are arranged in a column direction, i.e., a "Y" direction, this is merely for clarity; three or more strings may be arranged in the column direction.

Each of the strings ST11' to ST1m' and ST21' to ST2m' may include at least one source selection transistor SST, first to $n^{th}$ memory cells MC1 to MCn and at least one drain selection transistor DST.

The source selection transistor SST of each of the strings ST11' to ST1m' and ST21' to ST2m' may be coupled between a source line SL and the memory cells MC1 to MCn. In an embodiment, source selection transistors of strings arranged in the same row may be coupled to the same source selection line. Source selection transistors of the strings ST11' to ST1m' arranged in a first row may be coupled to a first source selection line SSL1. Source selection transistors of the strings ST21' to ST2m' arranged in a second row may be coupled to a second source selection line SSL2. In another embodiment, source selection transistors of the strings ST11' to ST1m' and ST21' to ST2m' may be coupled to a single source selection line in common.

The first to $n^{th}$ memory cells MC1 to MCn of each of the strings ST11' to ST1m' and ST21' to ST2m' may be coupled in series to one another between the source selection transistor SST and the drain selection transistor DST. Gates of the first to $n^{th}$ memory cells MC1 to MCn may be coupled to first to $n^{th}$ word lines WL1 to WLn, respectively.

In an embodiment, at least one of the first to $n^{th}$ memory cells MC1 to MCn may be used as a dummy memory cell. In a case where the dummy memory cell is provided, a voltage or a current of a corresponding string may be stably controlled. Accordingly, reliability of data stored in each memory block may be improved.

The drain selection transistor DST of each of the strings ST11' to ST1m' and ST21' to ST2m' may be coupled between a bit line and the memory cells MC1 to MCn. Drain selection transistors DST of the strings arranged in the row direction may be coupled to a drain selection line extended in the row direction. The drain selection transistors DST of the strings ST11' to ST1m' arranged in the first row may be coupled to a first drain selection line DSL1. The drain selection transistors DST of the strings ST21' to ST2m' arranged in the second row may be coupled to a second drain selection line DSL2.

That is, the memory blocks illustrated in FIG. 3 may be equivalent to the memory blocks illustrated in FIG. 2 in terms of circuit structure, except that the pipe transistor PT is excluded from each string in FIG. 3.

Figure 4:
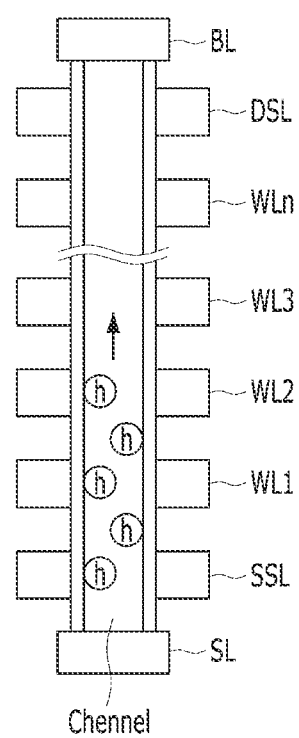
FIG. 4 is a cross-sectional diagram of a string for describing an issue that may arise during a read operation.

FIG. 4 is a cross-sectional diagram of a string for describing an issue that may arise during a read operation.

FIG. 4 illustrates one of a plurality of strings included in a plane on which a program operation is performed.

When the program operation is performed, a voltage may be applied to a plurality of word lines and a plurality of bit lines associated with a memory block to be programmed. In addition, the plurality of memory blocks MB1 to MBk in the plane described with reference to FIGS. 1 to 3 may share a source line SL. Accordingly, holes may unintentionally flow into a channel of the plurality of strings in the plane on which the program operation is performed.

Figure 5A:
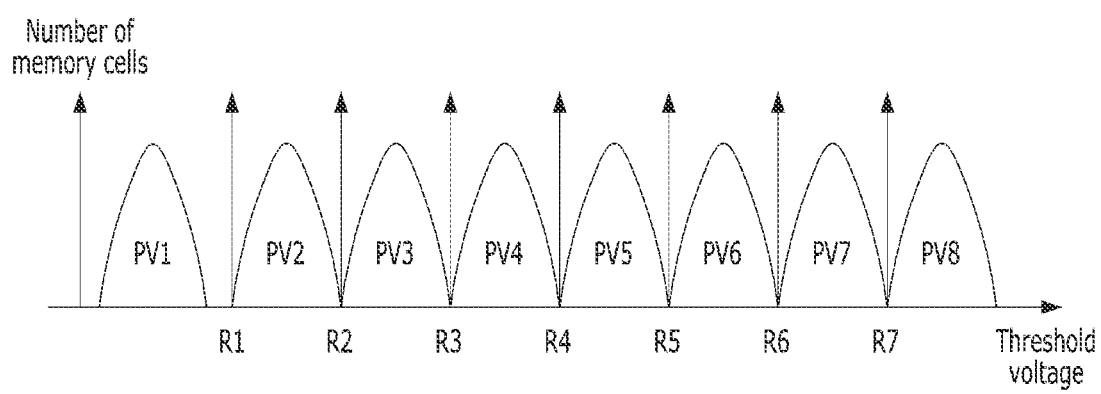
FIGS. 5A and 5B are diagrams illustrating threshold voltage distributions of a memory cell for describing an issue that may arise during a read operation.
Figure 5B:
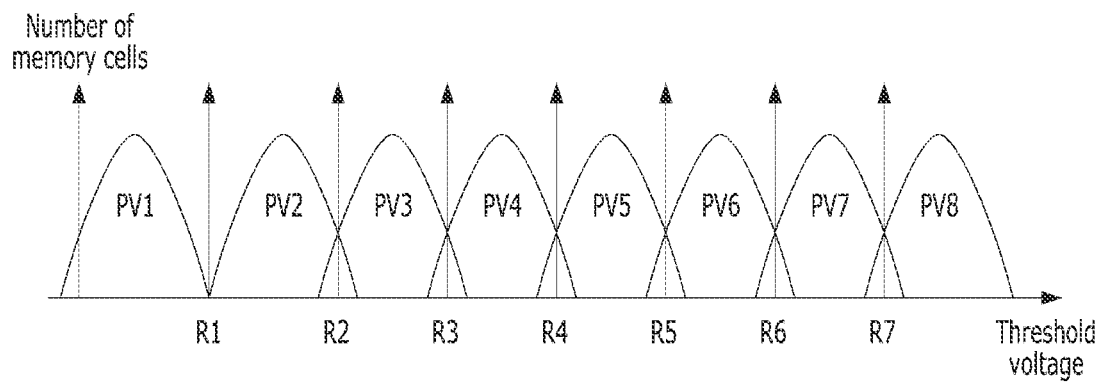

FIGS. 5A and 5B are diagrams illustrating threshold voltage distributions of a memory cell for describing an issue that may arise during a read operation.

Depending on implementation, the memory cell array 300 may include single level cells (SLCs) each storing 1-bit data or multi-level cells (MLCs) each storing multi-bit data. FIGS. 5A and 5B illustrate threshold voltage distributions of a triple level cell (TLC) capable of storing 3-bit data.

FIG. 5A is a diagram illustrating an ideal distribution of threshold voltages of triple-level cells.

Due to a small difference in electrical characteristics between memory cells, the threshold voltage of each of the memory cells programmed with the same data may have a threshold voltage distribution within a certain range. When a triple level cell is programmed, the triple level cell may have any one of eight program states PV1 to PV8. The respective threshold voltage distributions of the program states illustrated in FIG. 5A may have respective read voltage margins within set ranges without overlapping each other.

During the read operation, the voltage generator 700 may apply seven read voltages R1 to R7 to a selected word line, and determine an amount of current flowing through a bit line associated with the memory block, thereby differentiating between the respective program states PV1 to PV8.

FIG. 5B is a diagram illustrating a distribution of threshold voltages that triple-level cells may have when holes flow into a channel through a program operation.

When the holes flow into the channel, potential of a string to which the memory cells are coupled may change, and a current flowing through the string may change as the potential of the string changes. Therefore, the threshold voltages of the memory cells may change.

FIG. 5B illustrates that, with the change in the threshold voltages of the memory cells, the threshold voltage distributions of first to third program states PV1 to PV3 are mainly shifted to the right, and the threshold voltage distributions of sixth to eighth program states PV6 to PV8 are mainly shifted to the left. The threshold voltage distributions of the respective threshold voltage states illustrated in FIG. 5B may be obtained experimentally.

When a read operation is performed on a memory block into which holes flow, a read voltage may be applied to a drain selection line DSL, a source selection line SSL and word lines associated with the memory block to be read. When the read voltage is applied, a source selection transistor, a drain selection transistor and a plurality of memory cells of the memory block may be turned on, and a channel of the memory block may be electrically coupled to a source line SL having a ground voltage level. Therefore, the holes that have flowed into a channel of the memory block may be removed, and the changed threshold voltage may return to an original threshold voltage.

In other words, when the memory device 150 performs the program operation on a first memory block in a first plane, threshold voltages of memory cells of memory blocks in the first plane may change. When the memory device 150 applies a read voltage to a second memory block among the memory blocks in the first plane, the changed threshold voltage of memory cells of the second memory block may return to an original threshold voltage. That is, each of memory blocks in a specific plane may temporarily generate a lot of fail bits when being first read after the program operation is performed on that plane.

When the memory device 150 outputs data having a large number of fail bits in response to a read command, reliability of the read operation of the memory device 150 may be reduced. To maintain, or minimize reduction of, reliability, the memory device 150 may perform a dummy read operation on all memory blocks in a specific plane after the program operation is completed on the plane to return threshold voltages of memory cells in all the memory blocks to original levels. However, this may increase the time for the program operation including the dummy read operation on all memory blocks.

According to embodiments of the present disclosure described below, performance and reliability of the memory device 150 may be maintained even when the threshold voltages of the memory cells temporarily change due to the program operation.

According to a first embodiment of the present disclosure, the memory device 150 may store a flag, indicating whether a current threshold voltage has temporarily changed, for each memory block included therein. For example, when the program operation is performed on the first memory block in the first plane, the memory device 150 may set the flags of the respective memory blocks in the first plane. When a flag of a memory block to be read during the read operation is set, the memory device 150 may recognize the set flag as an indication to perform the dummy read operation on the memory block to restore the threshold voltages of memory cells within the memory block to original levels, before performing a valid read operation. A valid read operation refers to a read operation for outputting data in response to a read command, and a dummy read operation refers to an operation of applying a read voltage to restore the threshold voltages of memory cells within a target memory block to original levels, which is performed in advance of the valid read operation. After the dummy read operation is completed, holes that have flowed into a channel of the memory block may be removed, and so as to output data having high reliability through the valid read operation. When the dummy read operation is completed, the memory device 150 may reset the flag of the memory block to be read.

According to the first embodiment of the present disclosure, the memory device 150 may selectively perform the dummy read operation on the memory block to be read during the read operation, not on all the memory blocks, in the plane on which the program operation is performed, whenever the program operation is completed. Therefore, performance reduction of the memory device 150 may be minimized, and reliability of the memory device 150 may be maintained. The first embodiment of the present disclosure is described in detail with reference to FIGS. 6 to 9.

According to a second embodiment of the present disclosure, the memory device 150 may apply one or more first read voltages among read voltages to a selected word line, and remove holes that flowed into a memory block to be read when performing the read operation. The first read voltages may be read voltages (e.g., the fourth read voltage R4 illustrated in FIG. 5B) for differentiating between program states (e.g., the fourth and fifth program states PV4 and PV5 illustrated in FIG. 5B) of which corresponding threshold voltages are shifted less than other threshold voltages. After the holes are removed, the memory device 150 may apply second read voltages (different than the first read voltages) among the read voltages to be applied to the selected word line. As the first and second read voltages are applied, the memory device 150 may read data stored in the memory block to be read, based on a current flowing through bit lines associated with the memory block. The second embodiment of the present disclosure is described in detail with reference to FIG. 10.

Figure 6:
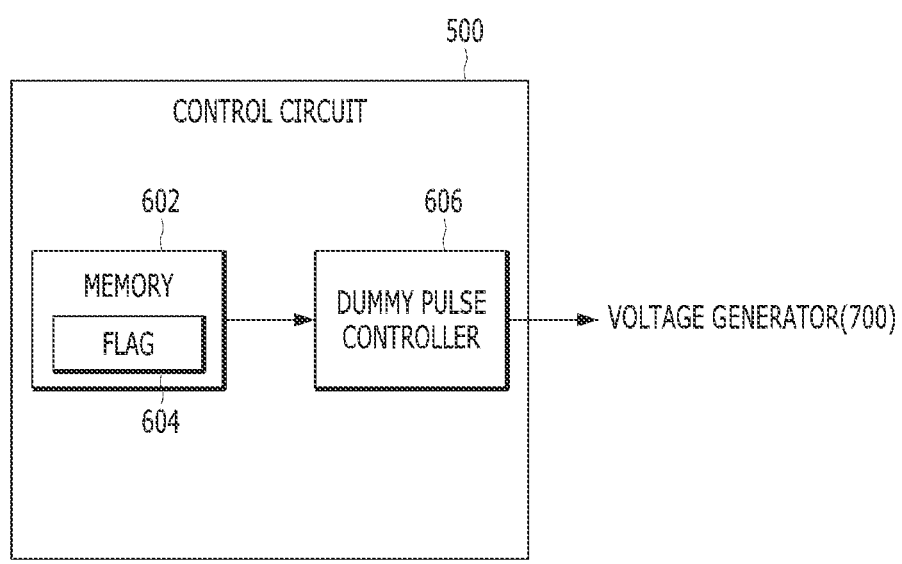
FIG. 6 is a block diagram illustrating a control circuit of a memory device in accordance with a first embodiment.

FIG. 6 is a block diagram illustrating the control circuit 500 of the memory device 150 in accordance with the first embodiment.

The control circuit 500 may include a memory 602 and a dummy pulse controller 606. The memory 602 may store a flag 604, indicating whether a current threshold voltage has temporarily changed, for each memory block in the memory device 150.

The dummy pulse controller 606 may refer to the flag 604 in response to a read command, and control the voltage generator 700 and the address decoder 440 to perform the dummy read operation before performing the valid read operation on a memory block to be read, based on a value of the flag of the memory block.

FIG. 7 is a diagram illustrating the flag 604 in accordance with the first embodiment.

The flag 604 may include flag values for respective memory blocks in the memory device 150. In the example of FIG. 7, the flag values of memory blocks in a plane on which the program operation has been performed but no read operation has yet been performed may be set to "1". The flag values of memory blocks on which the dummy read operation has been performed having the flag value of "1" may be reset to "0".

Figure 8:
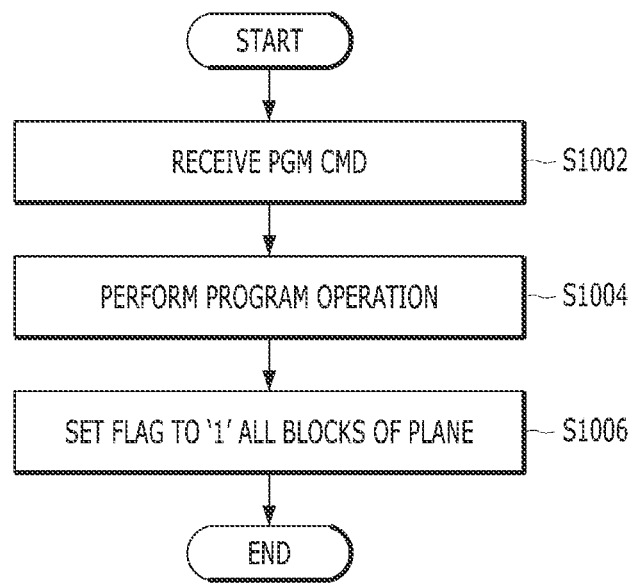
FIG. 8 is a flowchart illustrating a program operation in accordance with the first embodiment.

FIG. 8 is a flowchart illustrating the program operation in accordance with the first embodiment.

In operation S802, the control circuit 500 may receive a program command from an external device.

In operation S804, the memory device 150 may perform a program operation in response to the program command. For example, the control circuit 500 may control the voltage generator 700, the address decoder 440 and the input/output control circuit 420 so that data is programmed into a memory block in response to the program command.

When the program operation is performed, holes may temporarily flow into a channel of strings in a plane on which the program operation is performed, and thus threshold voltages of memory cells of memory blocks in the plane may change.

In operation S806, the control circuit 500 may set flag values of the memory blocks of the plane to "1" in the flag 604.

Figure 9:
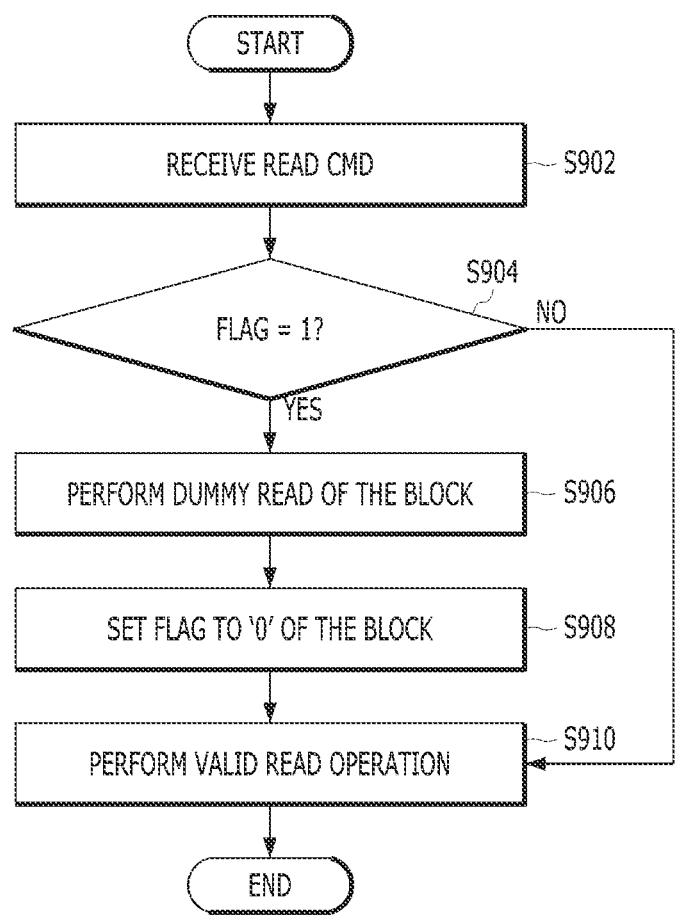
FIG. 9 is a flowchart illustrating a read operation in accordance with the first embodiment.

FIG. 9 is a flowchart illustrating the read operation in accordance with the first embodiment.

In operation S902, the control circuit 500 may receive a read command from an external device.

In operation S904, the control circuit 500 may refer to a flag value of a memory block to be read in the flag 604 in order to determine whether threshold voltages of memory cells of the memory block have changed.

When the flag value of the memory block to be read is set to "1" (that is, "YES" in operation S904), the memory device 150 may perform the dummy read operation on the memory block to be read, in operation S906. For example, the control circuit 500 may control the voltage generator 700 and the address decoder 440 to apply dummy pulses to word lines associated with the memory block to be read, thereby removing holes which have flowed through a channel of strings of the memory block. The controller 130 does not need data as a result of the dummy read operation. Depending on implementation, the control circuit 500 may omit an operation of providing the controller 130 with data buffered in a page buffer through the dummy read operation.

In operation S908, the control circuit 500 may reset the flag value of the memory block to be read to "0" in the flag 640.

In operation S910, the memory device 150 may perform a valid read operation on the memory block to be read. For example, the control circuit 500 may control the voltage generator 700 and the address decoder 440 to apply a read voltage to word lines associated with the memory block to be read. The control circuit 500 may output the read data to an external device, which data is read based on a current flowing through bit lines associated with the memory block to be read according to application of the read voltage.

Returning to operation S904, when the flag value of the memory block to be read is "0" (that is, "NO" in operation S904), the memory device 150 may perform operation S910 without performing the dummy read operation.

According to the first embodiment of the present disclosure, the memory device 150 may perform the dummy read operation only on a memory block to be read, instead of performing the dummy read operation on all memory blocks of a plane on which the program operation is performed, after the program operation is completed. In addition, when the read operation is performed again on the same memory block, the memory device 150 may perform a valid read operation without performing the dummy read operation.

All memory blocks of a specific plane may not be read until the program operation is performed on the plane and a next program operation is performed. According to the first embodiment of the present disclosure, the number of dummy read operations may be reduced compared to a case where the memory device 150 performs the dummy read operation on all memory blocks after completing the program operation. Therefore, performance degradation of the memory device 150 may be minimized, and reliability of the memory device 150 may be maintained.

Figure 10:
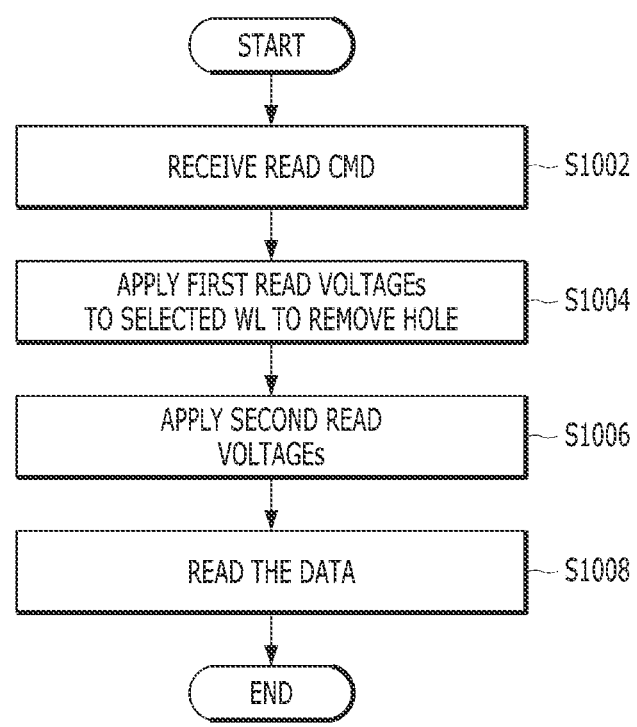
FIG. 10 is a flowchart illustrating a read operation of a memory device in accordance with a second embodiment.

FIG. 10 is a flowchart illustrating the read operation of the memory device 150 in accordance with the second embodiment.

In operation S1002, the control circuit 500 may receive a read command from an external device.

In operation S1004, the control circuit 500 may control the voltage generator 700 and the address decoder 440 to apply one or more first read voltages, among read voltages of a read voltage set, to a word line selected by the read command.

The first read voltages may be determined to differentiate between program states of which corresponding threshold voltages are shifted relatively less than other threshold voltages even though holes unintentionally flow after the program operation is performed. In the example of FIG. 5B, the threshold voltages of middle program states among the program states may be shifted relatively less. For example, the threshold voltages of the fourth and fifth program states PV4 and PV5 may be shifted relatively less through the program operation, as compared with the other program states.

Since the threshold voltage distribution of the middle program states is shifted relatively less, the program states may be relatively accurately differentiated when a read voltage in the middle among a plurality of read voltages is applied to the memory device 150 into which the holes flow. In the example of FIG. 5B, when the fourth read voltage R4 is applied, the fourth program state PV4 and the fifth program state PV5 may be relatively accurately differentiated. Thus, R4 is an example of a middle read voltage.

Accordingly, read voltages in the middle among the plurality of read voltages may be selected as the first voltages and applied to a selected word line. When the first read voltages are applied to the selected word line and a pass voltage is applied to a non-selected word line, some program states may be differentiated, and the holes having flowed into a channel of a memory block to be read may be removed.

In operation S1006, the control circuit 500 may control the voltage generator 700 and the address decoder 440 to apply second read voltages, which are different than the first read voltages, among the read voltages of the read voltage set, to the selected word line.

In operation S1008, the control circuit 500 may read data based on a current flowing through the bit line of the memory block as the first and second read voltages are applied.

According to the second embodiment of the present disclosure, the first read voltages in the middle among the plurality of read voltages of the read voltage set may be first applied during the read operation, thereby removing the holes. Since the current flowing through the memory block to be read is relatively less affected by the holes as the first read voltages are applied, the current may be used to differentiate between some program states. Therefore, since the separate dummy read operation can be omitted, deterioration of the reliability of the memory device 150 may be minimized without performance reduction of the memory device 150.

An example of a memory system to which the memory device 150, according to embodiments of the present disclosure, described with reference to FIGS. 1 to 10, may be applied is described with reference to FIG. 11.

Figure 11:
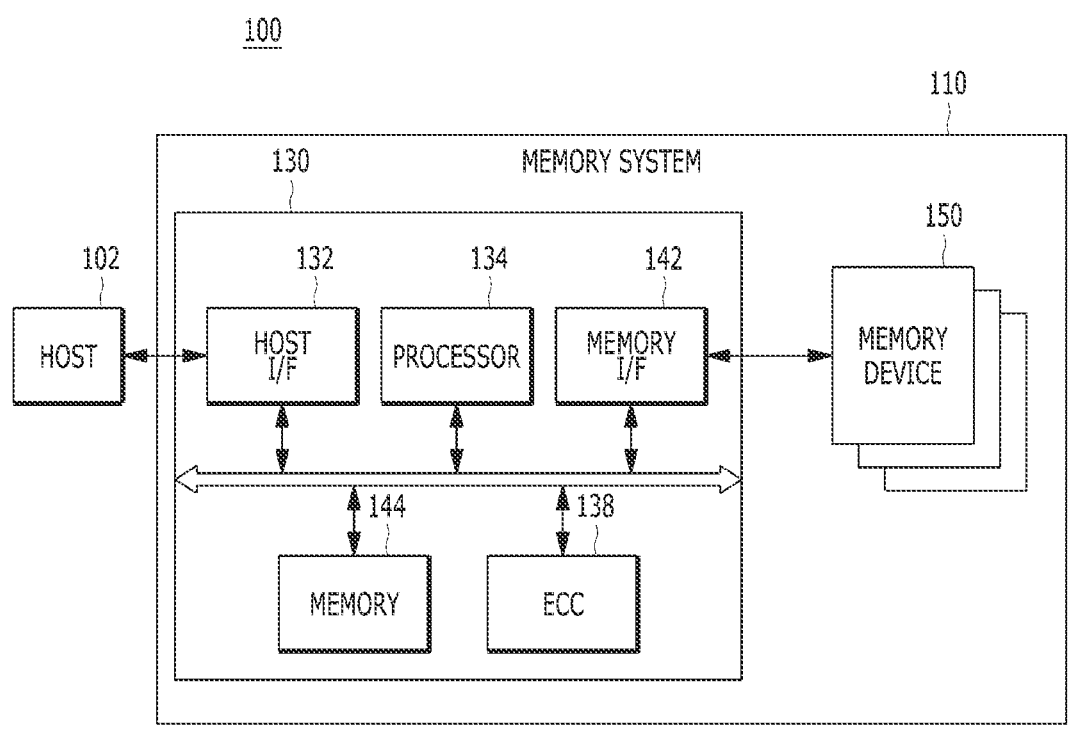
FIG. 11 is a schematic diagram illustrating an example of a data processing system including a memory device in accordance with embodiments.

FIG. 11 is a block diagram illustrating an example of a data processing system 100 including a memory system 110 in accordance with embodiments.

Referring to FIG. 11, the data processing system 100 may include a host 102 operatively coupled to the memory system 110.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall function and operation of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 include a solid state drive (SSD), a multi-media card (MMC), a secure digital (SD) card, a universal serial bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the like. The SD card may include a mini-SD card and micro-SD card.

The memory system 110 may be embodied by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and at least one instance of the memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card, such as a personal computer memory card international association (PCMCIA) card, compact flash (CF) card, smart media (SM) card, memory stick, multimedia card (MMC) including reduced size MMC (RS-MMC) and micro-MMC, secure digital (SD) card Including mini-SD card, micro-SD card and SDHC card, or universal flash storage (UFS) device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 according to embodiments of the present disclosure has been described in detail with reference to FIGS. 1 to 10.

The controller 130 may include a host interface (I/F) 132, a processor 134, an error correction code (ECC) component 138, a memory I/F 142 such as a NAND flash controller (NFC), and a memory 144, all operatively coupled via an internal bus.

The host I/F 132 may be configured to process a command and data of the host 102, and may communicate with the host 102 through one or more of various interface protocols, such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and/or integrated drive electronics (IDE).

The host I/F 132 may be driven through firmware referred to as a host interface layer (HIL) in order to exchange data with the host.

The ECC component 138 may detect and correct error(s) contained in the data read from the memory device 150. In other words, the ECC component 138 may perform an error correction decoding process to the data read from the memory device 150 through an ECC value used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component may correct error bits of data processed in the memory device 150, and include an ECC encoder and an ECC decoder. The ECC encoder may generate data with a parity bit by performing error correction encoding on data to be programmed into the memory device 150, and the data with the parity bit may be stored in the memory device 150. The ECC decoder detects and corrects errors in data read from the memory device 150 when reading the data stored in the memory device 150.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and/or Block coded modulation (BCM). However, the ECC component 138 is not limited to any specific structure. The ECC component 138 may include any and all circuits, modules, systems or devices for suitable error correction.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory I/F 142 may be driven through firmware referred to as a flash interface layer (FIL) in order to exchange data with the memory device 150.

The memory 144 may serve as a working memory of the memory system 110 and the controller 130, and store data for driving the memory system 110 and the controller 130. The controller 130 may control the memory device 150 to perform read, program and erase operations in response to a request from the host 102. The controller 130 may provide data read from the memory device 150 to the host 102, may store data provided from the host 102 into the memory device 150. The memory 144 may store data for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In another embodiment, the memory 144 may be embodied by an external volatile memory having a memory interface transferring data between the memory 144 and the controller 130.

As described above, the memory 144 may store data for performing a data write/read operation between the host and the memory device 150 and data when the data write/read operation is performed. In order to store such data, the memory 144 may include a program memory, data memory, write buffer/cache, read buffer/cache, data buffer/cache, map buffer/cache or the like.

The processor 134 may control overall operation of the memory system 110. The processor 134 may drive firmware to control overall operation of the memory system 110. The firmware may be referred to as flash translation layer (FTL). Also, the processor 134 may be realized as a microprocessor or a central processing unit (CPU).

For example, the controller 130 may perform an operation requested by the host 102 through the processor 134. In other words, the controller 130 may perform a command operation corresponding to a command received from the host 102. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134. For example, the background operation performed on the memory device 150 may include a garbage collection (GC) operation, a wear-leveling (WL) operation, a map flush operation, or a bad block management operation.

According to embodiments of the present disclosure, it is possible to provide a memory device and an operating method thereof which can reduce access time.

While the present disclosure has been illustrated and described with respect to specific embodiments, it will be apparent to those skilled in the art that various changes and modifications may be made without departing from the spirit and scope of the invention as defined in the following claims. Therefore, the scope of the present invention encompasses all variations that fall within the scope of the claims including their equivalents.

What is claimed is:

1. A memory device comprising:
one or more planes each including a plurality of memory blocks; and
a control circuit configured to selectively perform a dummy read operation before a valid read operation on the first memory block, in response to whether a read command on the first memory block being firstly received from a host after a program operation is performed on a plane including the first memory block,
wherein the dummy read operation is an operation of applying a read voltage to electrically couple the channel of the first memory block to a source line having a ground voltage level through the operation of applying the read voltage without outputting data in response to the dummy read operation.

2. The memory device of claim 1,
wherein the valid read operation is a read operation for outputting data in response to the read command.

3. The memory device of claim 2,
further comprising a memory configured to store a flag value for each memory block,
wherein the control circuit performs the program operation on a second memory block in response to a program command, sets the flag values for the respective memory blocks in the plane including the second memory block,
wherein the control circuit selectively performs the dummy read operation on the first memory block according to the flag value corresponding to the first memory block, and
wherein the control circuit resets the flag value corresponding to the first memory block.

4. The memory device of claim 3, wherein the control circuit performs the dummy read operation on the first memory block when the flag value corresponding to the first memory block is set.

5. A memory device comprising:
one or more planes each including a plurality of memory blocks;
word lines and bit lines coupled to memory cells in the one or more planes; and a control circuit configured to: selectively apply one or more first read voltages, among a plurality of read voltages, to a selected word line to electrically couple a channel of a first memory block to a source line having a ground voltage level through the applying the one or more first read voltages without outputting data in response to selectively applying the one or more first read voltages, apply, to the selected word line, second read voltages, among the plurality of read voltages, the second read voltages being different than the first read voltages, and read data based on a current flowing through bit lines by applying the second read voltages, wherein the control circuit selectively applies the one or more first read voltages in response to whether a read command on the first memory block being firstly received from a host after a program operation is performed on a plane including the first memory block.

6. The memory device of claim 5, wherein the first read voltages are for differentiating between two or more program states of which corresponding threshold voltages are shifted least by holes that have flowed into the channel.

7. The memory device of claim 6, wherein the first read voltages are middle voltages among the plurality of read voltages.

8. An operating method of a memory device, the operating method comprising:
performing a program operation on a first block within a plane without performing a dummy read operation on all blocks within the plane;
performing, in response to a read command for reading data from a second block within the plane, a dummy read operation on a second block within the plane; and
performing, in response to the read command, a second read operation on the second block,
wherein the dummy read operation is an operation of applying a read voltage to electrically couple the channel of the first memory block to a source line having a ground voltage level through the operation of applying the read voltage without outputting data in response to the dummy read operation.

9. The operating method of claim 8,
wherein the second read operation is for reading the data.

10. The operating method of claim 8,
wherein the dummy read operation is performed with one or more read biases in a middle of a range of read biases for reading the data, and
wherein the second read operation is performed with remaining read biases, excluding the one or more middle range read biases.

\* \* \* \* \*